United States Patent [19]

Ishida et al.

[11] Patent Number: 4,868,634
[45] Date of Patent: Sep. 19, 1989

[54] IC-PACKAGED DEVICE

[75] Inventors: Yoshihiro Ishida; Yoshio Iinuma; Shingo Ichikawa, all of Saitama, Japan

[73] Assignee: Citizen Watch Co., Ltd., Tokyo, Japan

[21] Appl. No.: 158,764

[22] Filed: Feb. 22, 1988

[30] Foreign Application Priority Data

Mar. 13, 1987 [JP] Japan .................................. 62-58398
Apr. 21, 1987 [JP] Japan .................................. 62-98123

[51] Int. Cl.⁴ ..................... H01L 23/48; H01L 29/44; H01R 9/00; H02G 13/08
[52] U.S. Cl. ...................................... 357/68; 357/71; 357/45; 357/80; 357/72; 174/52.4; 361/393; 361/404; 361/414
[58] Field of Search ........................ 357/75, 71, 72, 68, 357/45, 80; 432/187, 189, 205, 207, 209; 174/52 FP; 361/380, 392, 393, 395, 414, 404; 365/51, 63

[56] References Cited

U.S. PATENT DOCUMENTS

| | | | |
|---|---|---|---|
| 3,611,317 | 10/1971 | Bonfeld | 357/75 |
| 3,784,883 | 1/1974 | Duncan et al. | 357/80 |
| 3,959,579 | 5/1976 | Johnson | 357/80 |
| 4,237,522 | 12/1980 | Thompson | 361/416 |
| 4,458,297 | 7/1984 | Stopper et al. | 361/416 |
| 4,558,171 | 12/1985 | Gantley et al. | 357/75 |
| 4,646,126 | 2/1987 | Iizuka | 357/71 |
| 4,717,988 | 1/1988 | Landis | 361/416 |
| 4,720,690 | 1/1988 | Popck et al. | 361/406 |

FOREIGN PATENT DOCUMENTS

1437024 5/1976 United Kingdom .................. 357/68

Primary Examiner—Eugene R. LaRoche
Assistant Examiner—Michael B. Shingleton
Attorney, Agent, or Firm—Koda and Androlia

[57] ABSTRACT

An IC-packaged device comprises a lower plate which has wiring patterns at least on an upper surface; an upper plate which has upper surface wiring patterns and at least an opening hole and are superimposed on the lower plate when used; and a plurality of IC chips which has a lot of connecting terminal groups mounted on the upper plate. In this structure, some of the connecting terminal groups of the plurality of IC chips are wire-bonded to the wiring patterns on the upper plate, while the other of the connecting terminal groups of the plurality of IC chips pass through the opening hole in the upper plate and are wire-bonded directly to the wiring patterns on the lower plate.

6 Claims, 9 Drawing Sheets

IC-PACKAGED DEVICE

BACKGROUND OF THE INVENTION

1. Field of the Invention

This invention relates to an IC-packaged device having a plurality of multiterminal IC chips, such as a memory card.

2. Description of the Related Art

In recent years, as the capacities of semiconductor memories, e.g. ROM's and RAM's, have been increased, memory cards in which a lot of IC chips for these semiconductor memories are packaged upon or within a single substrate, have been manufactured and used in a wide area of application such as games and process controls.

However, the above IC chips for semiconductor memories have each thirty to fifty connecting terminals, and these connecting terminals are common connecting terminals such as data bus terminals and control bus terminals, with the exception of some individual terminals such as a chip enable terminal. Thus there is a problem of connecting and wiring of these common connecting terminals and individual connecting terminals on a small substrate.

Figure 1:
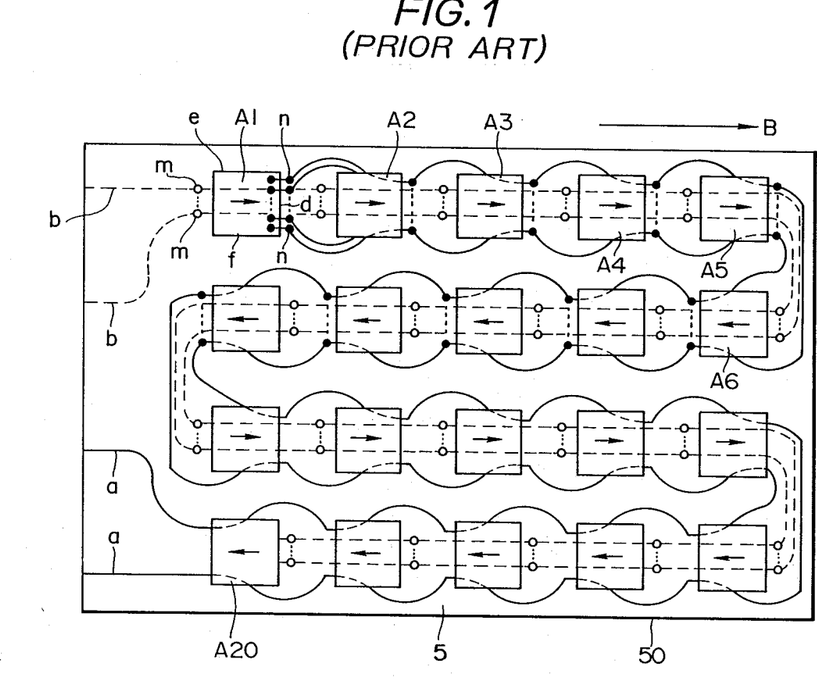
FIG. 1 is a plan view of a conventional memory card.
Figure 2:
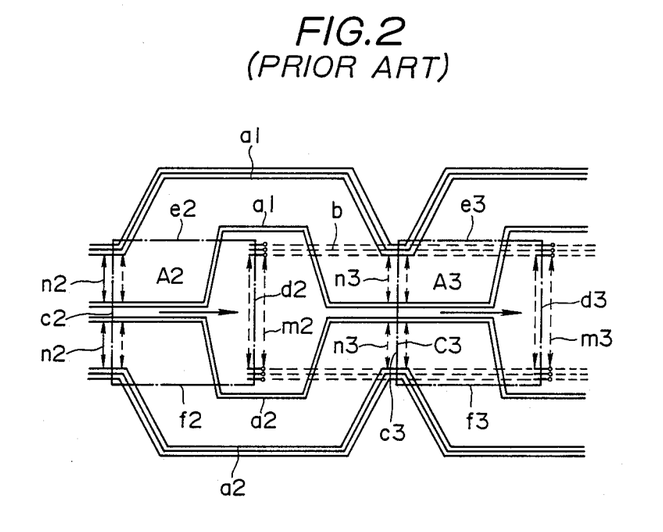
FIGS. 2 and 3 are a partially plan view and a partially sectional view both of the memory card shown in FIG. 1.
Figure 3:
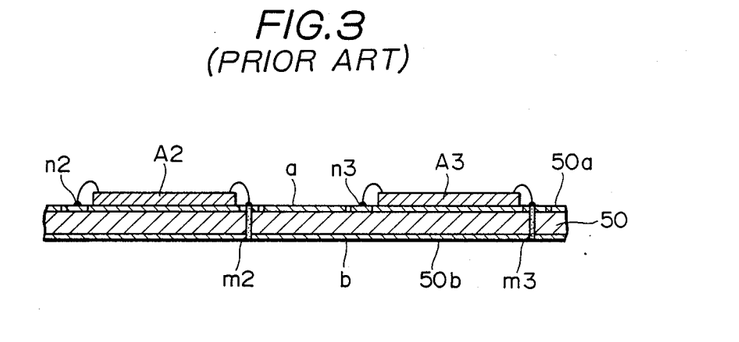

A conventional wiring structure will now be described with reference to the drawings:

FIG. 1 is a plan view of a conventional memory card; FIG. 2 is a partially plan view illustrating connecting and wiring between IC chips of the conventional memory card shown in FIG. 1; and FIG. 3 is a partially sectional view thereof. A substrate 50 which forms a memory card 5 is a double-sided wiring board, as shown in FIG. 3. On an upper surface 50a, twenty IC chips denoted at $A_1$ to $A_{20}$ are bonded, and upper surface patterns "a" each shown by a solid line, bonding patterns "n" each shown by a black circle and through-hole patterns "m" each shown by a white circle are provided. On the other hand, on a lower surface 50b, lower surface patterns "b" each shown by a dotted line are provided and connected to upper surface 50a by means of through-hole patterns "m".

As shown in FIG. 2, each IC chip "A" is square-shaped, and one pair of corresponding sides "c" and "d" are each provided with connecting terminals while the other pair of corresponding sides "e" and "f" are not provided with any connecting terminal (each side of one IC chip is shown by a dotted line for ease of understanding). And all the connecting terminals provided at side "c" are common connecting terminals, and among the connecting terminals provided at side "d", nineteen terminals are common connecting terminals and one terminal is a chip enable terminal.

Connecting and wiring between the above IC chips will be described with reference to $A_1$, $A_2$ and $A_3$.

As shown in FIG. 2, twenty connecting terminals provided at side $c_2$ of IC chip $A_2$ are connected to respective bonding patterns $n_2$, and twenty connecting terminals provided at side $d_2$ are connected to respective through-hole patterns $m_2$ each by wire bonding. In a similar way, as for IC chip $A_3$, connecting terminals at side $c_3$ are connected to the respective bonding patterns $n_3$, and connecting terminals at side $d_3$ are connected to respective through-hole patterns $m_3$ each by wire bonding. Half (ten in number) of bonding patterns $n_2$ connected to connecting terminals of IC chip $A_2$ are connected to respective bonding patterns $n_3$ connected to the common connecting terminals of IC chip $A_3$, by means of ten upper surface patterns $a_1$ which are arranged on the upper part (on the plane of the drawing) of IC chip $A_2$ so as to avoid the through-hole patterns $m_2$, and the remaining bonding patterns $n_2$ are connected to the corresponding bonding patterns $m_3$ of IC chip $A_3$ by means of ten upper surface patterns $a_2$ which are arranged on the lower part (on the plane of the drawing) of IC chip $A_2$. Furthermore through-hole patterns $m_2$ connected to connecting terminals of IC chip $A_2$, are directly connected to through-hole patterns $m_3$ of IC chip $A_3$ by means of lower surface patterns "b" arranged on the lower surface of substrate 50.

That is to say, the above-mentioned structure allows connections between common connecting terminals which are provided at one side of each IC chip to be made on upper surface 50a to which IC chips are bonded. On lower surface 50b where no IC chip exists, connections between common connecting terminals provided at the other side of the IC chip are made at the same time the wiring of an individual connecting terminal is separately made all over the surface.

The above is the connection structure between the respective IC chips. Next, the entire connection structure will be described with reference to FIG. 1.

That is to say, twenty IC chips $A_1$ to $A_{20}$ are arranged and bonded in four rows on substrate 50 in the arrangement direction, as shown by arrow B. At this time, as shown by arrows, by reversing the direction of IC chips every row, the IC chips can be connected on the same plane without crossing the connections between IC chips throughout each of rows.

As mentioned above, the conventional memory card is designed so that the sides of an IC chip having connecting terminals will be perpendicular to the arrangement direction of IC chips on the substrate. Therefore, wiring between common connecting terminals must be divided into the upper surface and the lower surface of the substrate. As a result, there is a problem that since a costly double-sided print board must be used and a costly process of making through-hole patterns must be conducted, the cost of the entire memory card is raised.

On the other hand, by use of a single-sided print board, it is possible to make all connections between common connecting terminals on the IC chip bonding surface, but this requires considerably wide wiring space at both sides of an IC chip, and therefore, it is necessary to make an arrangement, with the distance between IC chips kept long. As a result, there causes a problem that the number of IC chips being mountable on a single card is limited.

SUMMARY OF THE INVENTION

The object of the present invention is to provide an IC-packaged device such as a memory card which is free of the above problems, low in cost and has a high packing density.

Therefore, according to the present invention, there is provided an IC-packaged device comprising a lower plate having wiring patterns at least on an upper surface; an upper plate having upper surface wiring patterns and at least an opening hole, the upper plate being superimposed on the lower plate when used; and a plurality of IC chips having a lot of connecting terminal groups mounted on the upper plate; some of the connecting terminal groups of the plurality of IC chips being wire-bonded to the wiring patterns on the upper plate, the other of the connecting terminal groups of the plurality of IC chips passing through the opening hole in the upper plate and being wire-bonded directly to the wiring paterns on the lower plate.

Also, according to the present invention, in particular, there is provided an IC-packaged device wherein each of the IC chips is an IC chip for a memory and has a plurality of common connecting terminal groups and a chip select terminal for selecting the individual IC chip; the IC chips are linearly arranged in at least one row; the opening hole in the upper plate is an elongated opening hole having longer sides parallel to a direction of arrangement of the linearly arranged IC chips; each of IC chips has common connecting terminal groups at a first side parallel to the longer sides of the elongated opening hole and at a second side perpendicular to the first side, respectively, the common connecting terminal group at the second side perpendicular to the longer sides of the elongated opening hole being wire-bonded to the wiring patterns on the upper plate, and the common connecting terminal group at the first side parallel to the longer sides of the elongated opening hole being passing through the elongated opening hole and wire-bonded directly to the wiring patterns on the lower plate.

Furthermore, according to the present invention, in particular, there is provided in an IC-packaged device wherein the opening hole is provided in a corresponding position to each IC chip on the upper plate; the wiring patterns on the upper plate is two sets of wiring patterns provided parallel to the arrangement of the IC chips; the one common connecting terminal group at the first side of the IC chip and the other common connecting terminal group at the second side opposite to the first side are wire-bonded to the two sets of wiring patterns on the upper plate respectively, and simultaneously each of IC chip select terminals passes through the opening hole corresponding to the position of each IC chip, and is wire-bonded directly to each of the wiring patterns on the lower plate.

Also, according to the present invention, there is provided an IC-packaged device wherein each of the IC chips is arranged inclinedly with reference to a direction of the arrangement of the linearly arranged IC chips; the first side of the IC chip having one common connecting terminal group and a chip select terminal and a third side which is adjacent to the first side and has no common connecting terminal groups are superimposed on one set of the two sets of wiring patterns on the upper plate; and the second side of the IC chip having the other common connecting terminal group and a fourth side which is adjacent to the second side and has no common connecting terminal group are superimposed on the other set of two sets of wiring patterns on the upper plate.

According to the present invention, furthermore, there is provided an IC-packaged device wherein on the upper plate, a seal frame is provided for enclosing the plurality of IC chips, and a resin is injected inside the seal frame.

DETAILED DESCRIPTION OF THE PREFERRED EMBODIMENTS

Embodiments of the present invention will now be described in detail with reference to the drawings.

Figure 4:
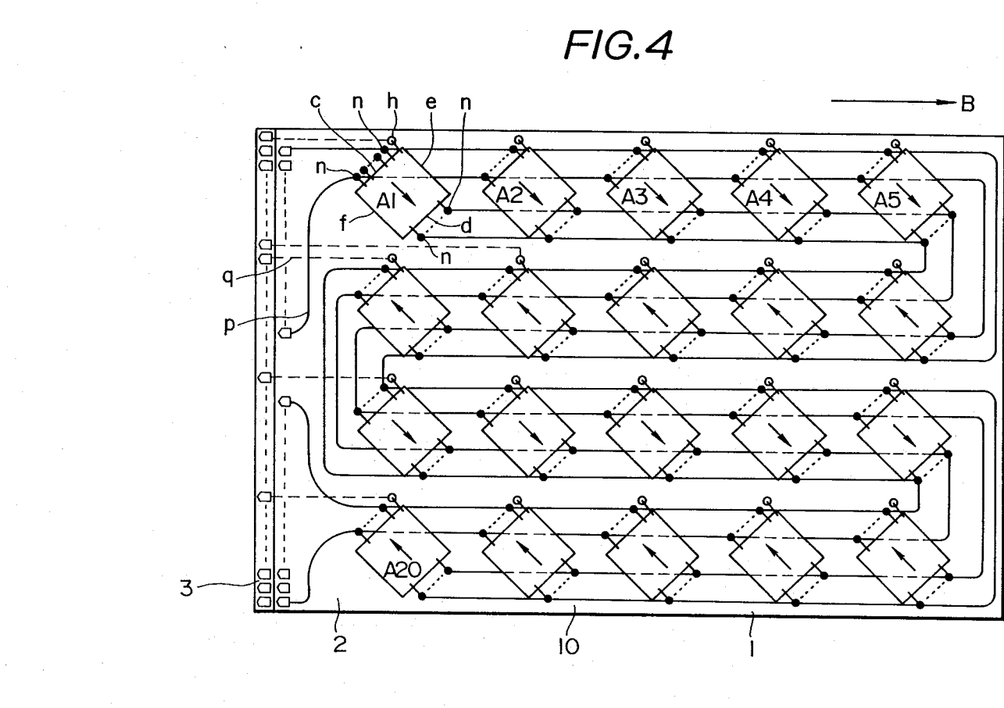
FIG. 4 is a plan view of a first embodiment of a memory card according to the present invention.
Figures 5, 6:
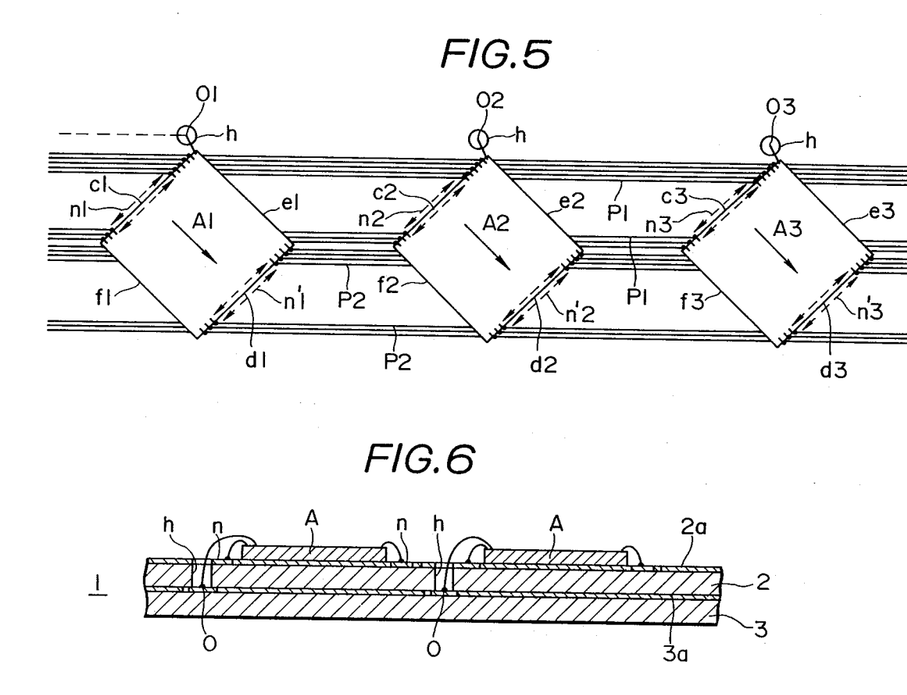
FIGS. 5 and 6 are a partially plan view and a partially sectional view of the memory card shown in FIG. 4.

FIG. 4 is a plan view of a first embodiment of a memory card according to the present invention; FIG. 5 is a partially plan view illustrating the connecting and wiring between IC chips; and FIG. 6 is a partially sectional view thereof.

As shown in FIG. 6, a substrate 1 which forms a memory card, comprises a lamination of an upper plate 2 and a lower plate 3 both made of a single-sided print board. Pattern surface 2a of upper plate 2 is provided with upper surface patterns "P", bonding patterns "n" and opening holes "h", all of which are shown by solid lines, while pattern surface 3a of the lower plate 3 is provided with lower surface patterns "q" shown by dotted lines and bonding patterns "o" which are respectively placed in positions corresponding to opening holes "h" in upper plate 2.

And as shown in FIG. 4, twenty IC chips $A_1$ to $A_{20}$ are bonded on pattern surface 2a of the above upper plate 2 in such a manner that the respective sides c, d, e and f of each IC chip are inclined with reference to the direction of arrangement shown by arrow B.

Connecting and wiring between the above IC chips will be described about IC chips $A_2$ and $A_3$. As shown in FIG. 5, nineteen common connecting terminals provided at side $c_2$ of IC chip $A_2$ are each wire-bonded to each of bonding patterns $n_2$, and one chip enable terminal is bonded via one opening hole h in upper plate 2 to bonding pattern $o_2$ of lower plate 3. Also, twenty common connecting terminals provided at side $d_2$ are connected to respective bonding patterns $n'_2$ each by wire bonding.

In a similar manner, as for IC chip $A_3$, each connecting terminal at side $c_3$ is wire-bonded to each bonding pattern $n_3$ and $o_3$, and each connecting terminal at side $d_3$ is wire-bonded to each bonding pattern $n'_3$. As a result, bonding patterns $n_2$ connected to connecting terminals of IC chip $A_2$ are connected to bonding patterns $n_3$ connected to common connecting terminals of IC chip $A_3$ adjacent to $A_2$, by means of nineteen upper surface patterns $P_1$ which pass the lower surface of IC chip $A_2$ and are led out of side $e_2$. This side $e_2$ has no connecting terminal. Also, bonding patterns $n'_2$ are connected to bonding patterns $n'_1$ of adjacent IC chip $A_1$, by means of twenty upper surface patterns $P_2$ which pass the lower surface of IC chip $A_2$ and are led out of side $f_2$ having no common connecting terminal. That is to say, the above-mentioned structure is designed so that connections between many common connecting terminals are made on pattern surface 2a of upper plate 2 to which IC chips A are bonded, and that connecting and wiring of a small number of individual connecting terminals are separately made all over pattern surface $3a$ of lower plate 3 where no IC chip exists.

As a result, this inclined arrangement of IC chips allows the wiring patterns between common connecting terminals to be arranged in a substantially linear shape. Also as for connecting and wiring from the upper surface to the lower surface of the substrate, although prior art has required a large number of connections and wires, the present invention uses only connections of a small number of individual connecting terminals. Therefore, it is possible to perform a wire bonding by providing opening holes larger than usual without providing through-hole patterns.

As mentioned above, according to the first embodiment of the present invention, a substrate is made of a lamination of low-cost single-sided print boards, and connections between common connecting terminals which are large in number are made on the upper plate, while individual connecting terminals which are small in number are connected via opening holes to the lower plate.

Also, the inclined arrangement of IC chips on the substrate allows connections between common connecting terminals to be made on one surface of the substrate without increasing the space for arrangement of IC chips. Therefore, a memory card having a high packing density can be provided by low-cost single-sided boards. At the same time, eliminating multiterminal through-hole patterns which are apt to cause problems leads to an improvement of reliability.

Figure 7:
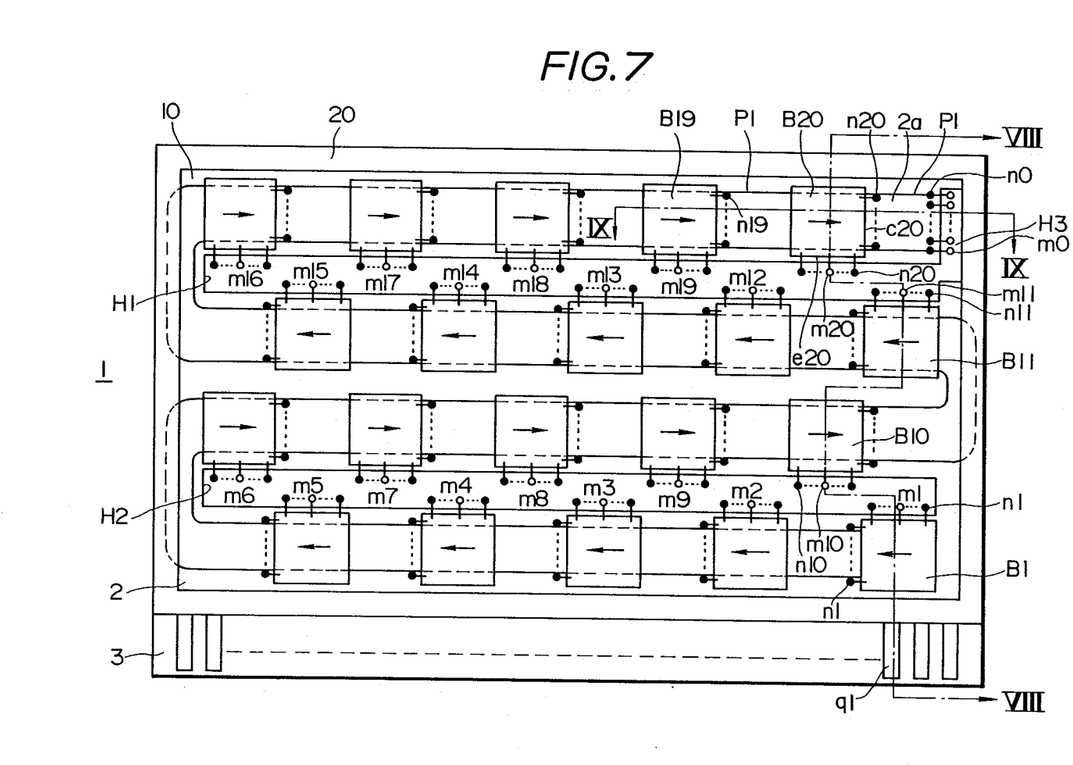
FIG. 7 is a plan view of a second embodiment of a memory card according to the present invention.
Figure 8:
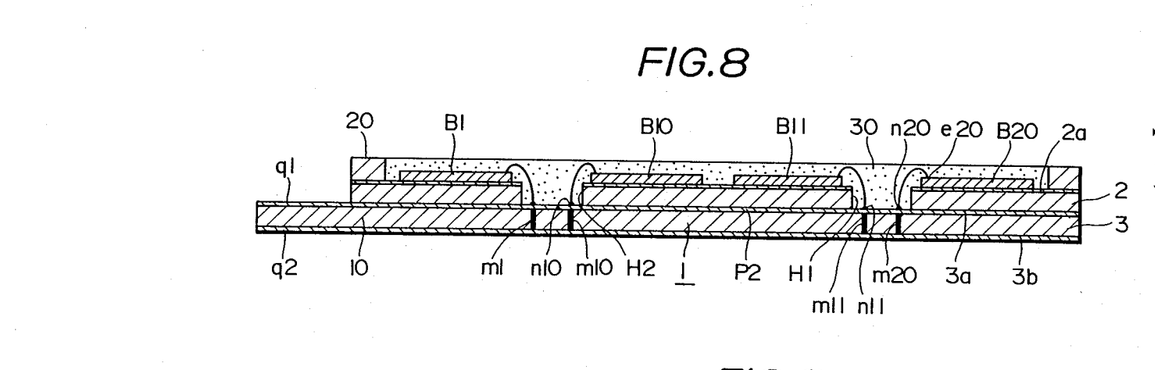
FIGS. 8 and 9 are sectional views taken along A—A and B—B respectively of the memory card shown in FIG. 7.
Figure 9:
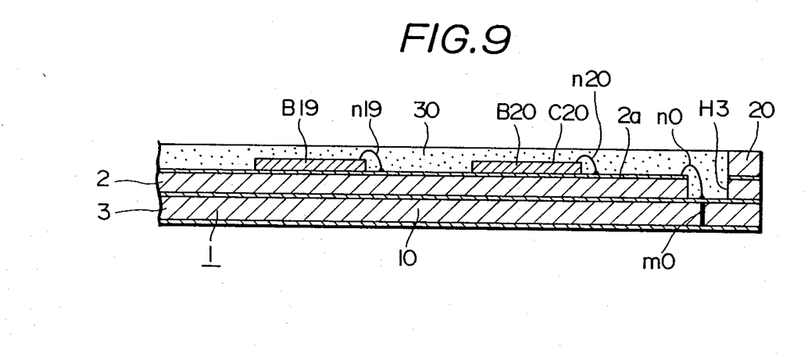
Figure 10:
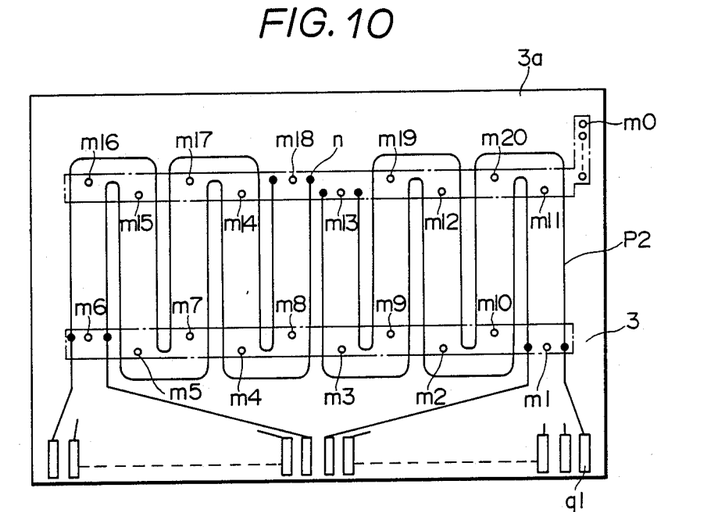
FIGS. 10 and 11 are a top plan view and a bottom plan view both of the lower plate of the second embodiment.
Figure 11:
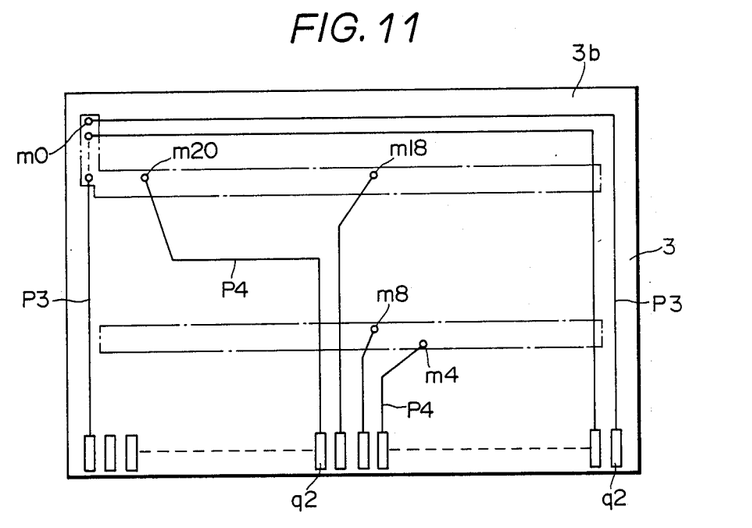
Figure 12:
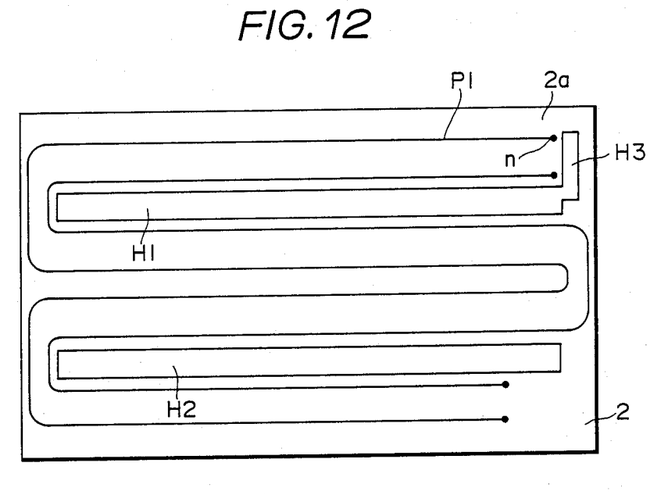
FIG. 12 is a plan view of the upper plate of the second embodiment.
Figure 13:
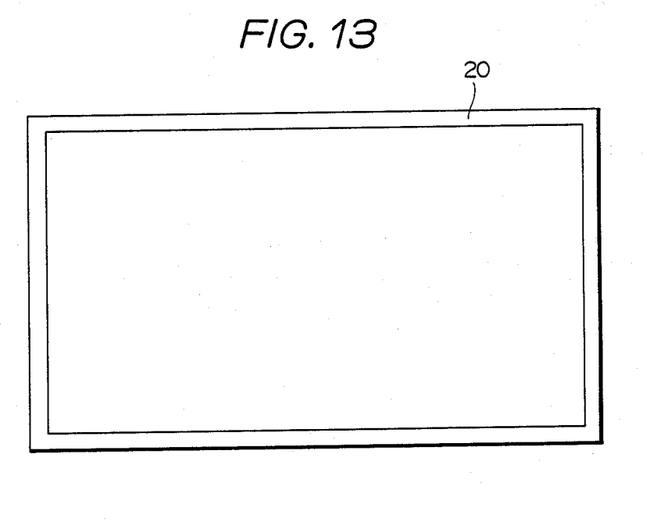
FIGS. 13 and 14 are plan views of seal frames according to the present invention.

FIG. 7 is a plan view of a second embodiment of a memory card according to the present invention; FIGS. 8 and 9 are sectional views taken along A—A and B—B, respectively of the memory card shown in FIG. 7; FIGS. 10 and 11 are a top plan view and a bottom plan view both of the lower plate of this embodiment; FIG. 12 is a plan view of the upper plate of this embodiment; and FIG. 13 is a plan view of a seal frame.

As shown in FIGS. 8 and 9, a substrate 1 which forms a memory card 10, comprises a structure in which an upper plate 2 made of a single-sided print board is laminated on an upper surface of a lower plate 3 made of a conventional double-sided print board. A pattern surface $2a$ of upper plate 2 is, as shown in FIGS. 7 and 12, provided with lead patterns $P_1$, bonding patterns n, two elongated opening holes $H_1$ and $H_2$ and an elongated opening hole $H_3$ for connecting leads are provided. Along each of longer sides of two elongated opening holes $H_1$ and $H_2$, twenty IC chips $B_1$ to $B_{20}$ are arranged. Among the four sides of IC chip square, at one side along each of the longer sides of the elongated opening holes $H_1$ and $H_2$ and at a second side which is perpendicular to the above one side, connecting terminals for each IC chip are provided by halves respectively. Also, as shown in FIG. 10, on upper pattern surface $3a$ of the lower plate 3, lead patterns $P_2$ and bonding patterns n and connecting electrodes $q_1$ are provided, and, as shown in FIG. 11, on lower pattern surface $3b$ of the lower plate 3, lead patterns $P_3$, individual lead patterns $P_4$ and connecting electrodes $q_2$ are provided, and upper pattern surface $3a$ and lower pattern surface $3b$ are connected by through-hole patterns m.

Next, connecting and wiring between IC chips will be described about IC chips $B_{10}$, $B_{19}$ and $B_{20}$. That is to say, as illustrated by IC chip $B_{20}$ in FIG. 7, common connecting terminals provided at side $C_{20}$ perpendicular to the longer sides of the elongated opening hole $H_1$ is wire-bonded to bonding patterns $n_{20}$ provided on pattern surface $2a$ of upper plate 2 and thus connected to bonding patterns $n_{19}$ of adjacent IC chip $B_{19}$ and to bonding patterns $n_0$ for connection between plates by means of lead patterns $P_1$.

And by wire-bonding each IC chip to patterns $P_1$ shown in FIG. 12, the common connecting terminals of all IC chips are connected in common.

Furthermore by wire-bonding the bonding patterns $n_0$ for connection between plates, via elongated opening hole $H_3$, to the upper pattern surface of the through-hole patterns $m_0$ provided in lower plate 3, as shown in FIG. 11, the above-mentioned common connecting terminals of all IC chips are connected to connecting electrodes $q_2$ by means of lead patterns $P_3$ provided on lower pattern surface $3b$.

Also, in IC chip $B_{20}$, the common connecting terminals among connecting terminals provided at its side $e_{20}$ which is parallel to the longer sides of the elongated opening hole $H_1$ are wire-bonded, via elongated opening hole $H_1$, to bonding patterns $n_{20}$ provided on upper pattern surface $3a$ of lower plate 3 and thus connected to bonding patterns $n_{10}$ and $n_{11}$ for adjacent IC chips $B_{10}$ and $B_{11}$ by means of lead patterns $P_2$ (FIG. 10).

And by wire-bonding each IC chip to lead patterns $P_2$ as shown in FIG. 10, the common connecting terminals of all IC chips are connected in common and at the same time they are connected to connecting electrodes $q_1$.

Also one chip enable terminal of each chip included in the above-mentioned side $e_{20}$ (FIG. 7) is wire-bonded to the upper pattern surface of through-hole pattern $m_{20}$ provided in lower plate 3 via elongated opening hole $H_1$ and thus connected to connecting electrode $q_2$ by individual lead pattern $P_4$ provided on lower pattern surface $3b$ of lower plate 3.

As mentioned above, in connection for a board which is packed with many IC chips, by wire-bonding via elongated opening holes, the number of through-hole patterns can be greatly reduced. As a result, the reliability of an IC-packaged device having high packing density can be enhanced and simultaneously wiring freedom on each plate can be increased.

When comparing the number of through-hole patterns in the package structure of this embodiment with those in the conventional package structure shown in FIG. 1, for twenty IC chips, the conventional structure requires twenty through-hole patterns per IC chip and thus requires $20 \times 20 = 400$ through-hole patterns in total, but this embodiment of the present invention requires through-hole patterns for half of common connecting terminals, i.e. twenty through-hole patterns $m_0$ and a through-hole pattern $m_1$ to $m_{20}$ for a chip enable terminal necessary for each IC chip and thus requires $20 + 20 = 40$ in total, thereby reducing the number of through-hole patterns to 1/10.

Thus, packing and connecting of IC chips have been completed. Next, protection will be made against IC chips and wires. As shown in FIGS. 7 and 8, a seal frame 20 (FIG. 13) is set on pattern surface $2a$ of upper plate 2 and a seal resin 30 (FIGS. 8 and 9) is injected into the inside of seal frame 20, thereby sealing the package portions of IC chips and the wire-bonded portions by resin.

Figure 14:
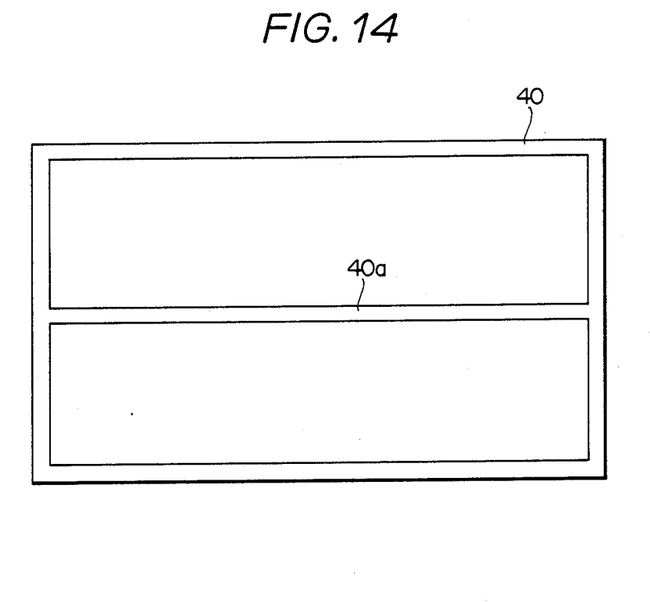

FIG. 14 shows another embodiment of seal frame. By providing a partition frame $40a$ in the center of the seal frame 40, the seal frame 40 is divided into a plurality of small-area seal frame portions. As a result, the recession in the middle portion of the injected seal resin is reduced, thereby making it possible to improve the effect of protection by seal.

In this regard, the partition frame 40a is not limited to the single number. If space of arrangement of IC chips is allowed, partition frames can be provided vertically and horizontally to enhance the effect of protection.

As mentioned above, by use of the seal frame enclosing the entire memory card board, the IC chips, bonding wires and wiring patterns are simultaneously sealed by resin. Thus a highly reliable memory card can be provided.

Thus the foregoing are the embodiments of the present invention. In either embodiment, the upper plate has only the upper surface wiring patterns (single-sided wiring) and opening holes and does not use a so-called through hole pattern. Also, the lower plate minimizes the number of through hole patterns. Therefore, the present invention provides a low-cost but highly reliable and highly densed IC-packaged structure, and especially it has a marked effect on the application to IC memory cards.

What is claimed is:

1. An IC-packaged device comprising:
   an upper plate having plural rows of rectangular opening holes provided in parallel with a side of said upper plate and a plurality of upper surface wiring patterns wired meanderingly around said opening holes;
   a plurality of IC chips mounted on the upper surface wiring patterns on said upper plate, along longer sides of each of said rectangular opening holes in said upper plate; and
   a lower plate having, on an upper surface thereof, a set of upper surface external connection electrode patterns and a plurality of upper surface wiring patterns connecting to said set of upper surface external connection electrode patterns;
   each of said IC chips having a first set of common connecting terminal groups at a side of said IC chip perpendicular to the longer sides of said rectangular opening holes and having a second set of common connecting terminal groups and a chip select terminal at another side of said IC chip parallel to the longer sides of said rectangular opening holes; said first set of common connecting terminal groups being wire-bonded to said wiring patterns on said upper plate, and said second set of common connecting terminal groups and said chip select terminal passing through the rectangular opening holes and being wire-bonded directly to said upper surface wiring patterns on said lower plate.

2. The IC-packaged device according to claim 1, wherein said upper plate has a wiring opening hole near one end of said upper surface wiring patterns of said upper plate, and said common connecting terminal groups of wiring patterns on said upper plate pass through said wiring opening hole and are wire-bonded to the wiring patterns on said lower plate.

3. The IC-packaged device according to claim 1, wherein said lower plate further has, on the upper surface thereof, through-hole patterns separated from said lower plate upper surface wiring patterns and has, on the lower surface of said lower plate, a set of lower surface external connection patterns provided in position corresponding to said lower plate upper surface external connection patterns, and lower surface wiring patterns connecting to said through-hole patterns and to said lower surface external connection patterns, and each of said chip select terminals of said IC chips passes through the rectangular opening holes in said upper plate and is wire-bonded to the through-hole patterns on said lower plate.

4. The IC-packaged device according to claim 2, wherein said lower plate has, on the upper surface thereof, through-hole patterns separated from said lower plate upper surface wiring patterns and located in position corresponding to said wiring opening hole in said upper plate and has, on the lower surface, lower surface wiring patterns connecting to said lower surface external connection electrode patterns, and said common connecting terminal groups of wiring patterns on said upper plate pass through said wiring opening hole and are wire-bonded to the through-hole patterns on said lower plate provided in position corresponding to said wiring opening hole.

5. The IC-packaged device according to claim 1, wherein said upper surface wiring patterns on said lower plate are continuous lead patterns reciprocating perpendicularly to the longer sides of rectangular opening holes in said upper plate, and bonding patterns are provided on portions of the upper surface wiring patterns on the lower plate, to be wire-bonded from said common connecting terminal groups existing along one side parallel to the longer sides of said rectangular opening holes of the upper plate, of each of said IC chips.

6. The IC-packaged device according to claim 1 or 5, wherein on the upper plate, a seal frame is provided for enclosing said plurality of IC chips, and a resin is injected inside said seal frame.

* * * * *